United States Patent
Bottero et al.

(10) Patent No.: US 8,223,869 B2
(45) Date of Patent: Jul. 17, 2012

(54) CONTROL CHANNEL DETECTION SCHEME

(75) Inventors: Mauro Bottero, Mougins le Haut (FR); Jens Berkmann, Munich (DE)

(73) Assignee: Intel Mobile Communications GmbH, Neubiberg (DE)

( * ) Notice: Subject to any disclaimer, the term of this patent is extended or adjusted under 35 U.S.C. 154(b) by 1103 days.

(21) Appl. No.: 11/938,035

(22) Filed: Nov. 9, 2007

(65) Prior Publication Data

US 2009/0122891 A1    May 14, 2009

(51) Int. Cl.
*H04L 5/12* (2006.01)
(52) U.S. Cl. ......... 375/265; 375/261; 375/260; 375/259
(58) Field of Classification Search .................. 375/265
See application file for complete search history.

(56) References Cited

U.S. PATENT DOCUMENTS

| 2004/0001428 A1 | 1/2004 | Datta et al. | |
|---|---|---|---|
| 2004/0044947 A1* | 3/2004 | Becker et al. | 714/795 |
| 2008/0247493 A1* | 10/2008 | Gutcher et al. | 375/341 |

OTHER PUBLICATIONS

3GPP TS 34.121-1 V8.0.0 (Sep. 2007) $3^{rd}$ Generation Partnership Project; Technical Specification Group Radio Access Network; User Equipment (UE) Conformance Specification; Radio Transmission and Reception (FDD); Part 1: Conformance Specification (Release 8), Section 9.4, pp. 693-702.

* cited by examiner

*Primary Examiner* — Shuwang Liu
*Assistant Examiner* — Michael Neff
(74) *Attorney, Agent, or Firm* — Eschweiler & Associates, LLC

(57) ABSTRACT

A method for detection of a control channel includes receiving data transmitted via the control channel. A control channel receive quality is estimated based on a metric difference between a metric of a known final trellis state and a minimum metric amongst the metrics of the trellis states based on the received data. It is decided whether or not to detect the control channel depending on the estimated control channel receive quality.

24 Claims, 5 Drawing Sheets

US 8,223,869 B2

CONTROL CHANNEL DETECTION SCHEME

FIELD OF THE INVENTION

The invention relates generally to the technique of control channel detection in communications systems.

BACKGROUND OF THE INVENTION

In many communications systems, in particular wireless mobile communications systems, one or more control channels are transmitted in addition to data channels. Such a control channel may contain information which must be known at the receiver before starting the detection of the data channel. Therefore, a fast detection of the control channel at a receiver is important for obtaining a high overall system performance.

BRIEF DESCRIPTION OF THE DRAWINGS

Aspects of the invention are made more evident by way of example in the following detailed description of embodiments when read in conjunction with the attached drawing figures, wherein.

DETAILED DESCRIPTION OF THE INVENTION

Figure 1:
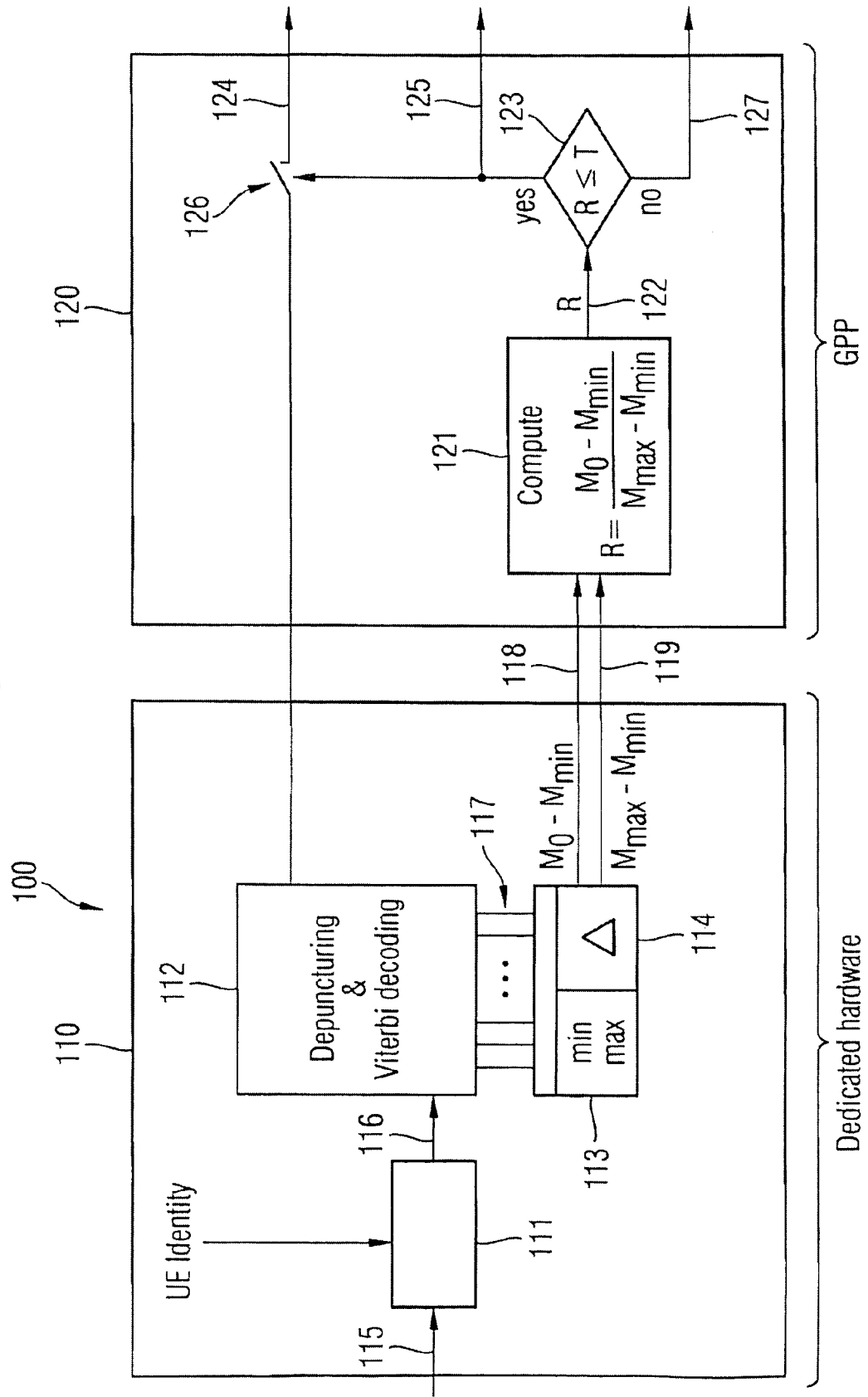
FIG. 1 is a schematic block diagram of a decoding and detection unit of a receiver according to a first embodiment.

In the following, embodiments of the invention are described with reference to the drawings, wherein like reference numerals are generally utilized to refer to like elements throughout the description. In the following description, for purposes of explanation, numerous specific details are set forth in order to provide a thorough understanding of one or more aspects of embodiments of the invention. It may be evident, however, to one skilled in the art that one or more aspects of the embodiments of the invention may be practiced with a lesser degree of these specific details. In other instances, known structures and devices are shown in a simplified representation in order to facilitate describing one or more aspects of the embodiments of the invention. The following description is therefore not to be taken in a limiting sense, and the scope of the invention is defined by the appended claims.

In mobile communications systems, a transmitter transmits user data via user data channels and control data via one or more control channels to a receiver. The transmitter may be a base station of the wireless communications system and the receiver may be a mobile station of the wireless communications system. Such channels from a base station to a mobile station are termed downlink channels. However, the following description may also relate to data channels and control channels for transmission of user data and control information, respectively, transmitted from a mobile station to a base station. Such channels are referred to as uplink channels. Herein and in the related art, a mobile station will be referred to as a User Equipment (UE).

Wireless communications systems according to the following description may be CDMA (Code Division Multiple Access) systems in one embodiment. However, also other types of multiple access techniques could be used in wireless communications systems considered herein, and all such variations and alternatives are contemplated as falling within the scope of the invention.

A control channel intended for a receiver may contain an Identity (ID) bit sequence of the scheduled receiver. Usually, the ID bit sequence is contained in a leading part of the control channel transmitted by the transmitter. For instance, in this leading part of the control channel, the ID bit sequence may be used to mask additional control information such as e.g. information relating to the channelization code and/or the modulation scheme used at the transmitter to generate the user data signal to be transmitted. Therefore, the detection of the control channel may be based on an estimation of the decoding quality of the control channel at the receiver. If the control channel can be decoded with high (or better to say sufficient) quality, it may be assumed that the leading part of the control channel had been masked by the ID bit sequence of the scheduled receiver.

The detection performance of a receiver may be defined in terms of the "probability of missed detection" ($P_{md}$), i.e. the probability that the receiver misses the detection of the part of the control channel carrying its ID bit sequence, and the "probability of false alarm" ($P_{fa}$), i.e. the probability that the receiver falsely detects a part of the control channel carrying a different receiver's ID bit sequence or any other bit, sequence.

Typically, the detection of a control channel is a crucial algorithm for communications system performance. Missed detections reduce the communications system throughput and false detections trigger unnecessary receptions which will be aborted at a later stage of the reception process. However, this causes waste of terminal resources and power consumption.

FIG. 1 illustrates a first embodiment of a decoding and detection unit 100 of a receiver in a wireless communications system, which may be a UE or a base station. In the following embodiment, without limitation of the generality, the receiver is assumed to be part of a UE (i.e. a mobile station).

The decoding and detection unit 100 of a receiver contains a first section 110 and a second section 120. The first section 110 comprises a de-masking unit 111, a decoder 112, a minimum/maximum unit 113, and a difference unit 114. Control data contained in a downlink control channel and user data contained in a downlink data channel are input to the de-masking unit 111 via input 115. The de-masking unit 111 further receives the ID of the UE under consideration. The part of the control sequence which is masked by the ID of the scheduled UE is de-masked by the ID of the UE under consideration. De-masking may be performed by the inverse masking process, e.g. by a sign inversion process based on the UE's ID. Control data and user data are supplied by a demodulator (not shown) of the receiver to the input 115 of the first section 110.

The de-masked part of the control sequence is fed via connection 116 to the decoder 112. In one embodiment the decoder 112 may be a Viterbi decoder performing channel decoding. Further, the decoder 112 may perform a de-puncturing operation.

The Viterbi decoder 112 decodes the incoming data, here at first the de-masked leading part of the control channel. As known in the art, Viterbi decoders 112 are used to decode bit sequences which were subjected to channel encoding at the transmitter.

Viterbi decoding is based on finding the shortest path through a state diagram of an encoder register which is used for channel encoding at the transmitter. This diagram is known as a trellis diagram. In the trellis diagram, the states of the encoder register are plotted versus the discrete time k. According to the Viterbi algorithm, a branch metric which represents a measure of the probability of the branch is calculated for each possible branch between two states (previous state relating to the time stamp k→destination state relating to the time stamp k+1). The branch metrics are then added to the respective state metrics (which are frequently also referred to as path metrics in the literature) of the previous states (ADD). For branches leading to the same destination state, the sums which are obtained in this way are compared (COMPARE). That branch to the destination state under consideration whose sum of the branch metric and state metric of the previous state is a minimum is selected (SELECT) and forms the extension of the path leading to this previous state to the destination state. These three basic operations of the Viterbi algorithm are known as ACS-(ADD-COMPARE-SELECT) operations.

While from a combinational point of view, the number of paths through the trellis diagram increases exponentially as k rises (that is to say as time progresses), it remains constant for the Viterbi algorithm. This is because of the selection step (SELECT). Only one selected path ("survivor") per destination state is retained and can be continued. The other possible paths are rejected. Recursive path rejection is the concept used in the Viterbi algorithm to limit the number of paths while progressing through the trellis diagram.

In the following, without limitation of generality, it may be assumed that the length of the channel encoder register at the transmitter is n. This means that the encoder register has n register cells. In this case, the encoder register may be described by a trellis diagram having $2^n$ states. Thus, the decoder 112 has $2^n$ outputs 117, wherein at each output one state metric (of the $2^n$ state metrics) is output and updated every time stamp k.

It is now considered a time stamp $k_{dec}$ at which time the part of the control channel containing the de-masked ID of the UE is completely decoded. This is achieved when the bits of the de-masked ID are all trellis processed and when the encoder's state is known. The latter condition (known encoder's state) may be guaranteed by forcing the encoder to a zero state by appending an n bit sequence of zeros to the masked part of the control sequence containing the ID of the scheduled UE. By way of example, if n=8, a tail bit sequence (0,0,0,0,0,0,0,0) forces the channel encoder to its zero state. As a consequence, the state metric associated with the zero state in the trellis diagram at the Viterbi decoder 112 should be the minimum state metric amongst all state metrics at time stamp $k_{dec}$, which is n time stamps later than the time stamp corresponding to the last bit of the ID.

In the following, $M_0$ refers to the state metric at the known final trellis state (e.g. at the zero trellis state if a zero tail sequence is used), $M_{min}$ refers to the minimum state metric amongst the state metrics of the trellis states and $M_{max}$ refers to the maximum state metric amongst the state metrics of the trellis states at the $2^n$ state metric outputs of the decoder 112 at time stamp $k_{dec}$. $M_{min}$ and $M_{max}$ are determined by the minimum/maximum unit 113 in one embodiment.

The difference unit 114 calculates the metric differences $M_0-M_{min}$ and, optionally, $M_{max}-M_{min}$. These differences are passed via connections 118, 119 to a computing unit 121 located in the second section 120 of the receiver 100. In one embodiment the computing unit 121 may compute the following ratio of metric differences $$R = \frac{M_0 - M_{min}}{M_{max} - M_{min}}.$$

R provides a fair indication of the detection quality of the control channel at the UE (or, more generally, at the receiver). R may assume values in the range between 0 and 1, and the decoding quality improves as R gets close to 0. More specifically, as the minimum metric state should be the forced zero state, an error-free Viterbi decoding should result in R=0. Due to noise, it may be the case that the forced zero state is not the state having minimum state metric, i.e. $M_{min} < M_0$. However, also in this case, the zero state metric $M_0$ should at least be close to the minimum one $M_{min}$. Therefore, R stays small. On the other hand, when the Viterbi decoding has a substantial number of errors (for instance for a control channel which is not masked with the ID of the UE under consideration), the zero state metric $M_0$ can even be closer to the maximum state metric $M_{max}$. In this case, the ratio R increases indicating that the control channel is detected with low quality. Thus, the control channel receive quality is related to R and may thus be evaluated on the basis of R.

It is to be noted that the metric difference $M_{max}-M_{min}$ is used for scaling the metric difference $M_0-M_{min}$. The scaling is beneficial because Viterbi state metrics increase with the amplitude of the received signal, i.e. the SNR (Signal-to-Noise Ratio). Scaling by $M_{max}-M_{min}$ eliminates this influence of signal amplitude to the effect that R is virtually independent of the amplitude of the received signal. Further, it is known that Viterbi decoders such as e.g. real fixed-point Viterbi decoders scale the accumulated state metrics during the forward recursion, for instance by subtracting a constant from all the state metrics almost every time stamp in order to avoid overflow. Also such internal re-scaling operation of the Viterbi decoder 112 is canceled out by considering a ratio of metric differences.

It is to be noted that in alternative embodiments the denominator of the ratio R may be of a different type, i.e. need not necessarily be a difference $M_{max}-M_{min}$. For instance, also an average metric could be used. In this case, however, R would not be limited by 1.

R is passed via connection 122 to a quality comparator 123. The quality comparator 123 compares R with a threshold value T. T may e.g. be a fixed threshold value in one embodiment. If R is below or equal to the threshold value T, the control channel is decided to be a control channel of sufficient detection quality. Then, the detected control information (e.g. the modulation scheme and/or the channelization code) is output from the second section 120 of the receiver at control information output 124 and the reception of the user data channel is triggered at a first control output 125 enabling user data detection. Otherwise, if R is above the threshold value T, the detected control information is discarded (in FIG. 1, this is illustrated by an open switch 126 between the Viterbi decoder 112 and the control information output 124) and the detection of the user data channel is inhibited by activating a control output 127 which disables the detection of the user data. Thus, it is deciding to detect the control channel (i.e. to use its control information) whenever the detection quality (which may be expressed e.g. by $R^{-1}$) is higher than a threshold (in this case $T^{-1}$).

According to one embodiment the first section 110 of the receiver may be implemented in dedicated hardware whereas the second section 120 of the receiver may be implemented in software, e.g. as a General Purpose Processor (GPP). This solution provides for competitional efficiency because in such alternative embodiments all subtractions are performed in hardware, and for high flexibility because the threshold T and probably further algorithms for deciding about the detection of a control channel may be programmable by software.

In FIGS. 2 to 6 a specific embodiment relating to High Speed Downlink Packet Access (HSDPA) is shown. HSDPA has been introduced in the third Generation Partnership Project (3GPP) Release 5 to provide enhanced support for packet data services with improved system throughput and reduced system latency for peak data rates up to 14.4 Mb/s in the downlink direction from the base station to the UE. Most of the description of the embodiment illustrated in FIG. 1 may equally be applied to the second embodiment and is therefore partly omitted in order to avoid reiteration. On the other hand, details of the more specific second embodiment may equally apply to related aspects of the first embodiment.

HSDPA supports enhanced features such as shared channel transmission, adaptive modulation and coding (AMC), fast Hybride Automatic Repeat reQuest (HARQ), fair and fast scheduling at the NodeB (i.e. base station) rather than at the radio network controller (RNC) and Fast Cell Side Selection (FCSS). Further, HSDPA introduces a shorter Transmission Time Interval (TTI) of 2 ms (corresponding to 3 time slots) than in the previous releases in order to decrease Round Trip Time (RTT) delay. Amongst others, HSDPA introduces new shared and fast-scheduled physical channels:

HS-PDSCH (High Speed Physical Downlink Shared Channel) carries user data in the downlink direction. It is time shared between the UEs (i.e. mobile stations). To achieve a peak transfer rate of 14.4 Mb/s the NodeB can allocate up to 15 HS-PDSCHs to the same UE.

HS-SCCH (High Speed Shared Control Channel) is used by the NodeB to signal to the scheduled UE to receive HS-PDSCH(s) in the next TTI. In the meantime, it carries the HS-PDSCH(s) control information such as channelization codes, modulation schemes (e.g. QPSK (Quadrature Phase Shift Keying) or 16 QAM (Quadrature Amplitude Modulation)), transport block size, HARQ process number, redundancy and constellation version and a new data indicator. Further, the HS-PDSCH(s) control information contains an identity (ID) of the UE to which the message is addressed. In order to schedule several UEs, the NodeB can transmit up to 4 HS-SCCHs simultaneously.

Figure 2:
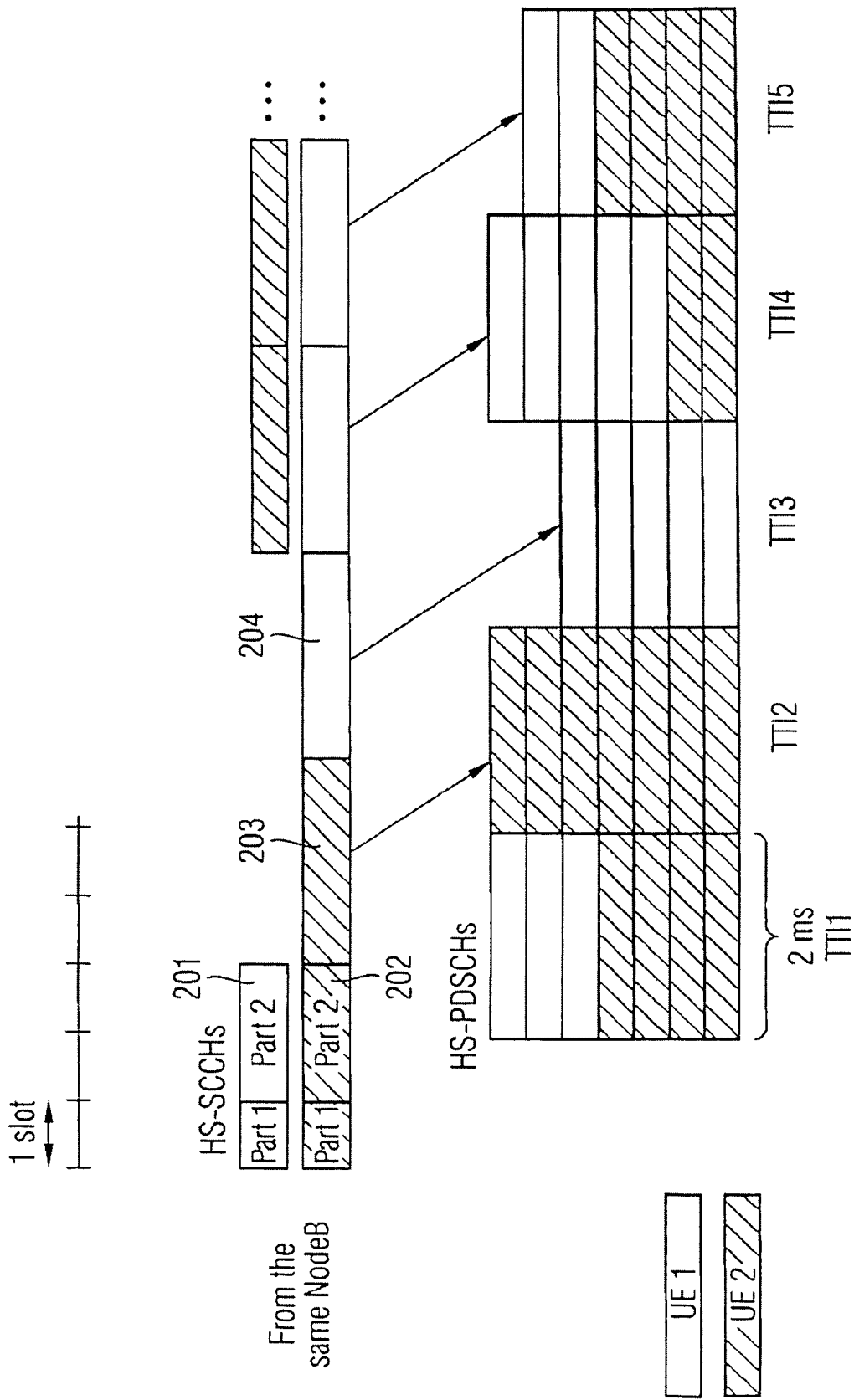
FIG. 2 is a schematic timing diagram of shared control channels and data channels.

FIG. 2 illustrates the timing of control channels HS-SCCHs and user data channels HS-PDSCHs. HS-SCCH(s) are sent two time slots in advance the corresponding HS-PDSCH(s) to allow enough time to the UE to configure itself for receiving the data channels. A first HS-SCCH 201 is addressed to a first UE denoted as UE1 and a second HS-SCCH 202 is addressed to a second UE denoted as UE2. Each HS-SCCH 201, 202 is divided into two functional parts: in Part 1, which spans over one time slot, the NodeB transmits urgent information such as the channelization codes and the modulation schemes while in Part 2, which spans over two time slots, the remaining (less time critical) information is transmitted. In the example illustrated in FIG. 2, two HS-SCCHs 201, 202 are transmitted simultaneously to UE1 and UE2. Two time slots later, i.e. at a time instance in the center of Part 2, UE1 and UE2 simultaneously start to detect user data channels HS-PDSCHs. More specifically, UE1 detects three HS-PDSCHs and UE2 detects four HS-PDSCHs during a first TTI of 2 ms (3 slots) referred to as TTI1. For the next transmission time interval TTI2, only control information in form of a HS-SCCH 203 for UE2 is provided. Thus, during TTI2, only UE2 is active and detects 7 HS-PDSCHs. For TTI3, the NodeB only supplies control information in form of a HS-SCCH 204 for UE1. Therefore, during TTI3, only UE1 is active and uses 5 HS-PDSCHs. This process of providing demodulation information by HS-SCCHs dedicated to a specific UE and demodulating the corresponding HS-PDSCHs in UE1 and/or UE2 continues during subsequent transmission time intervals TTI4, TTI5.

Figure 3:
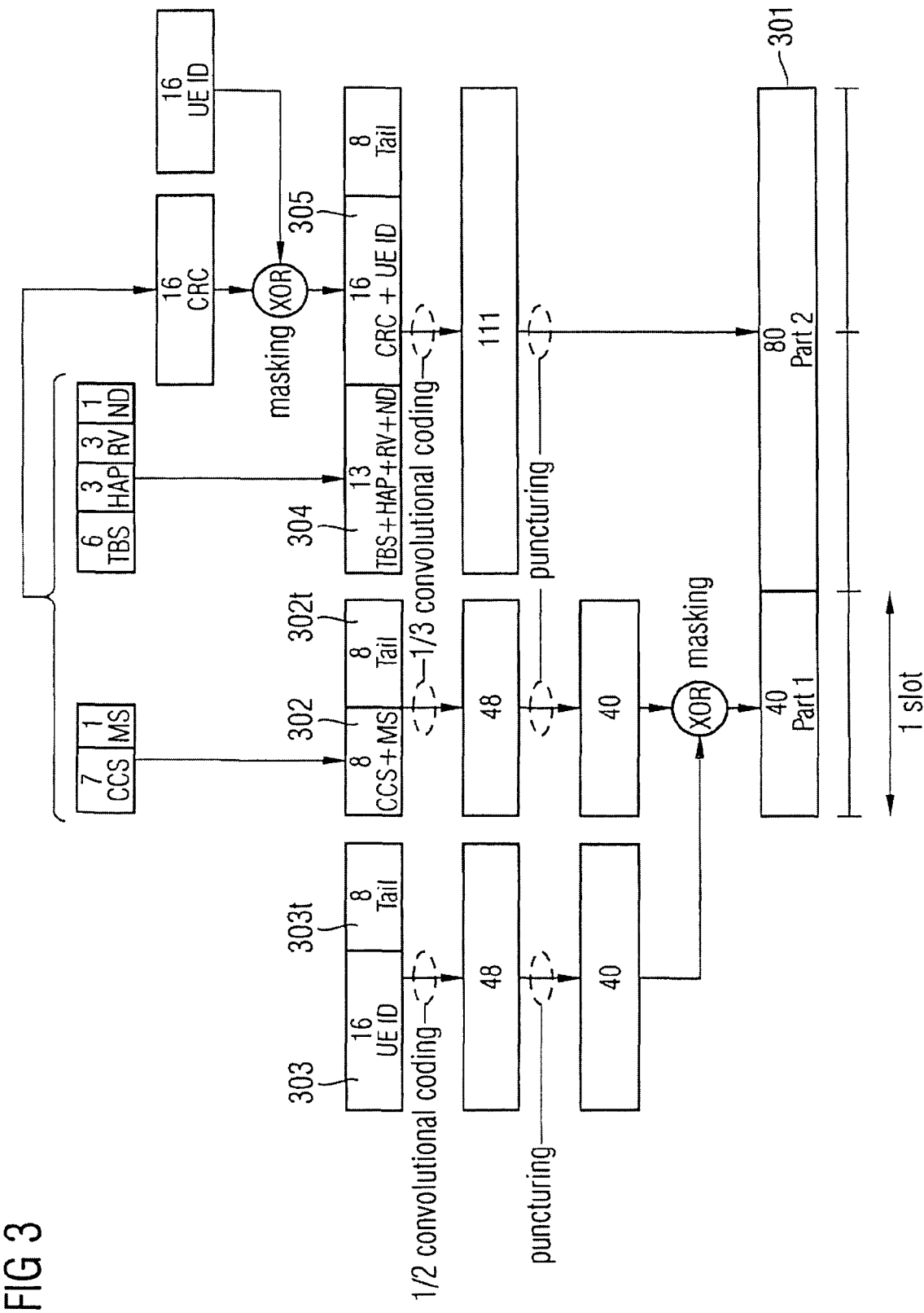
FIG. 3 is a schematic illustration of a shared control channel encoding process.

FIG. 3 illustrates one embodiment of HS-SCCH encoding. The abbreviations used in FIG. 3 are:
CCS: Channelization Code Set (7 bits)
MS: Modulation Scheme (1 bit)
TBS: Transport Block Size (6 bits)
HAP: Hybrid-ARQ Process (3 bits)
RV: Redundancy and constellation version (3 bits)
ND: New date indicator (1 bit)
CRC: Cyclic Redundancy Check (16 bits)
UE ID: User Equipment Identity (16 bits)

A HS-SCCH comprising Part 1 having 40 bits and Part 2 having 80 bits is denoted by reference number 301. As already mentioned HS-SCCH 301 spans over three times slots. In Part 1, CCS and MS information 302 are convolutionally encoded and masked (by an XOR operation) with the encoded 16-bits ID 303 of the scheduled UE (referred to as UE ID). In Part 2, TBS, HAP, RV and ND information 304 are convolutionally encoded together with a Cyclic Redundancy Check (CRC) masked with the UE ID. The same ⅓-rate convolutional code with 256 states is used in Part 1 and Part 2 encoding. Puncturing is used to reduce the number of bits of the convolutionally encoded UE ID information 303, convolutionally encoded CSS and MS information 302 and convolutionally encoded TBS, HAP, RV, ND, CRC and UE ID information 304, 305 to reduce the number of bits. Up to 4 HS-SCCHs addressing different UEs can be simultaneously transmitted from the serving HS-DSCH NodeB. Thus, each UE has to monitor all 4 HS-SCCHs in order to allow for a fast detection of the use of its UE ID in Part 1 in each HS-SCCH 301. Further, in connection with the embodiments described herein, the content of 3GPP TS 34.121 Release 5 is incorporated by reference into this document.

Thus, referring also to FIG. 2, after receiving Part 1 of all the HS-SSCH(s), the UE has only one time slot to make the decision: if one of the HS-SSCH(s) employing its UE ID is detected, the UE should configure the reception of the HS-PDSCH(s) with the decoded CCS and MS of the detected HS-SCCH.

Figure 4:
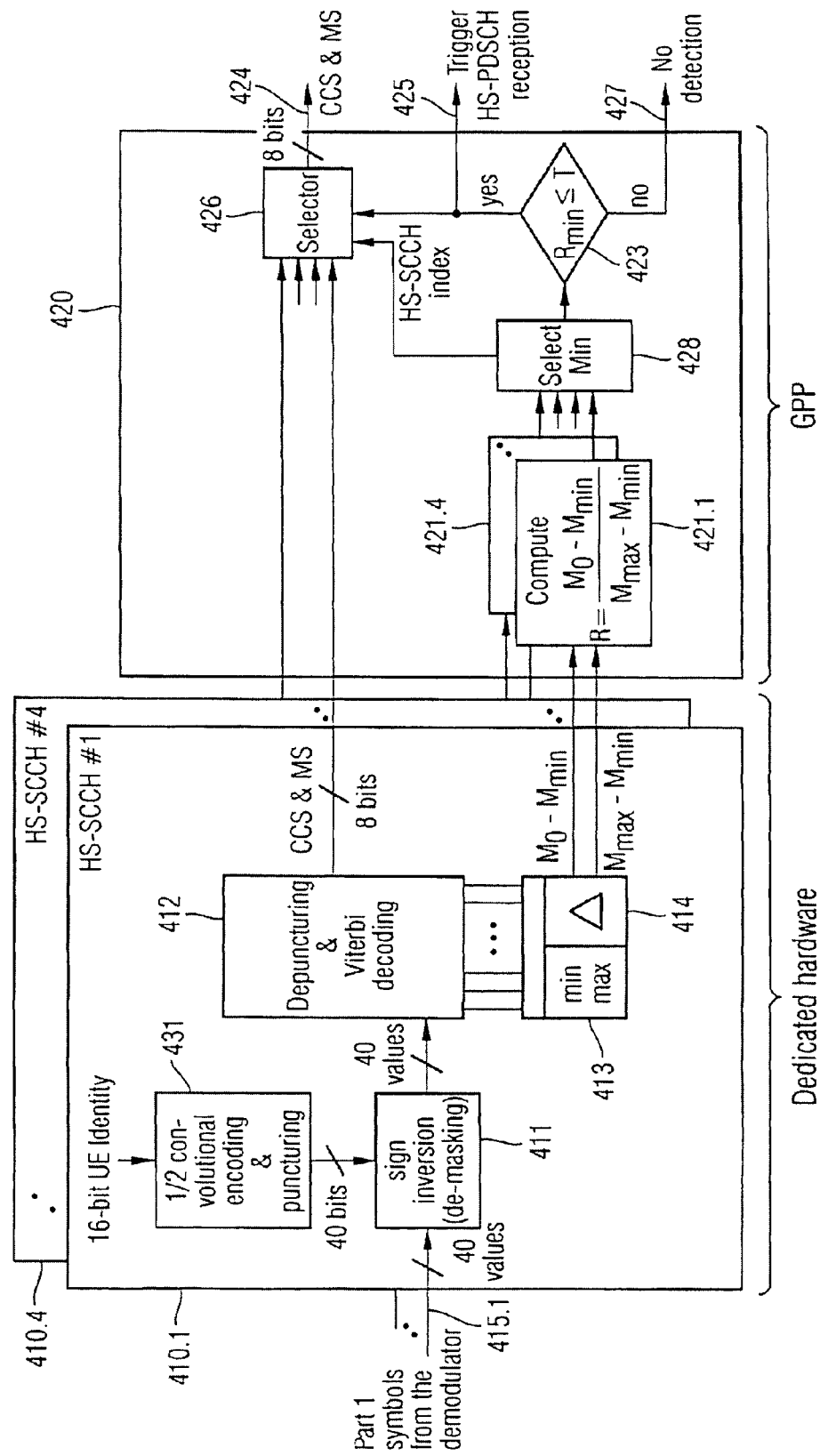
FIG. 4 is a schematic block diagram of a decoding and detection unit of a receiver according to a second embodiment.

FIG. 4 illustrates a decoding and detection unit 400 of a receiver according to a second embodiment. This receiver is adapted to provide for a fast detection of HS-SCCH(s) in HSDPA or, more generally, in a mobile communications system providing a plurality of shared control channels. The decoding and detection unit 400 comprises first sections 410.1, 410.2, . . . , 410.4 which may be implemented in dedicated hardware and a second section 420 which may be implemented in software e.g. as a GPP. The first sections 410.1-410.4 are configured to detect the four shared control channels HS-SCCH#1-HS-SCCH#4. The sections 410.1-410.4 may be implemented in one hardware instance which can be multiplexed in time according to the number of monitored control channels according to one embodiment. Instead, the plurality of first sections 410.1-410.4 may be also implemented in parallel hardware. The second section 420 is typically implemented in one GPP which is fed by the e.g. time multiplexed outputs of the four first sections 410.1-410.4.

The implementation and operation of each first section 410.1-410.4 are similar to the implementation and operation of the first section 110 illustrated in FIG. 1, and the description thereof is analogously applicable to first sections 410.1-410.4. Each first section 410.1-410.4 comprises a de-masking unit 411, a decoding unit 412, a minimum/maximum unit 413 and a difference unit 414 which correspond to units 111, 112, 113 and 114 of FIG. 1, respectively. Here the 16-bit UE ID is convolutionally encoded and punctured in UE processing unit 431 according to the Part 1 generation scheme of a HS-SCCH shown in FIG. 3. A bit sequence which is coming from a demodulator arranged in the signal path upstream of the first sections 410.1-410.4 is input via input connection 415.1 to the de-masking unit 411. There, it is de-masked by sign inversion dependent from the output of the UE processing unit 431.

Similar to the first embodiment, the example viterbi decoder 412 provides a final accumulated metric for each trellis state at the end of the forward recursion performed for decoding Part 1 of the HS-SCCH 301. Referring to FIG. 3, both the UE ID information 303 and the CCS and MS information 302 are terminated by a 8-bit tail sequence 303t. This 8-bit tail sequence may be (0,0,0,0,0,0,0,0), thus forcing the 8-bit register of the channel encoder to the zero state at the end of encoding the Part 1 of HS-SCCH 301. Of course, any other state known to the receiver could be chosen, and such alternatives are contemplated by the invention. As state metrics computed by a Viterbi decoder 112, 412 may reflect the Euclidian distance between the received bit sequence and the bit sequence corresponding to the most likely path through the trellis diagram, the metric of the zero state should be the minimum metric amongst all metrics computed by the Viterbi decoder 412 at the end of the Part 1 decoding forward recursion. Therefore, as already explained further above, the metric difference $M_0-M_{min}$ is a measure of the quality of detection of the HS-SCCH under consideration. In order to avoid fixed-point problems (e.g. an overflow) during Viterbi decoding, the state metrics are typically scaled during the forward recursion by subtracting a constant to all state metrics every or almost every time stamp. For example, the minimum branch metric computed at each time stamp may be subtracted from all state metrics. It is to be noted that such scaling is typically different for decoding different HS-SCCHs, i.e. among decoder units 412 which decode different control channels.

The difference units 414 output metric differences $M_0-M_{min}$ and $M_{max}-M_{min}$ for each HS-SCCHs. These metric differences are fed into computing units 421.1-421.4, which are implemented in software in one embodiment. In other words, the second section 420 (e.g. a GPP) computes in a time multiplexed fashion ratios R for all HS-SCCHs which are presently detected.

The ratios R associated with the qualities of the detected HS-SCCHs are input to a control channel selection unit 428. The control channel selection unit 428 may be implemented by a minimum algorithm selecting the ratio R which is smaller than all other ratios R delivered to the control channel selection unit 428. This ratio $R_{min}$ is passed to a quality comparator 423 having the same functionality as quality comparator 123 of the first embodiment. Further, a HS-SCCH index denoting the HS-SSCH having the minimum R (i.e. $R_{min}$) is output from the control channel selection unit 428 and passed to a selector 426.

The operation of the second section 420 is similar to the operation of the second section 120 illustrated in FIG. 1, and the description thereof is analogously applicable to second section 420. Briefly, if $R_{min}$ is greater than the (e.g. fixed) threshold T, the detection quality of all HS-SCCHs is too poor and no detection of a HS-PDSCH is initiated. In this case, a control output 427 is activated. Otherwise, if $R_{min}$ is below or equal to the threshold T, a control output 425 (corresponding to control output 125 of the first embodiment) is enabled and reception of the corresponding HS-PDSCH is initiated. In this case, the selector 426 is activated by the quality comparator 423 and the CCS and MS information contained in Part 1 of the selected HS-SCCH indexed by the control channel selection unit 428 is provided at output 424 of the second section 420. On the basis of this information, the receiver configures itself to start user data reception from the HS-PDSCH associated with the selected HS-SCCH one time slot later.

It is to be noted that the scaling of the metric difference $M_0-M_{min}$ by the metric difference $M_{max}-M_{min}$ in the denominator of ratio R in one embodiment allows to compare the ratios R obtained from different HS-SCCHs in the control channel selection unit 428, because this decoder-individual scaling further eliminates the use of different scaling factors in Viterbi decoding of different HS-SCCHs.

The software-hardware split illustrated in FIGS. 1 and 4 should be understood to be exemplary. For instance, another embodiment possibility is to implement the minimum-maximum operation performed by the minimum/maximum units. 113, 413 and the subtraction operation performed by the difference units 114, 414 in software. In this case, the first section 110, 410.1-410.4 may be implemented by standard hardware and substantially all computation for control channel quality estimation is done in software. In another embodiment, the computing units 121, 421.1-421.4 and/or others of the units in the second sections 120, 420 may be implemented in hardware.

Figure 5:
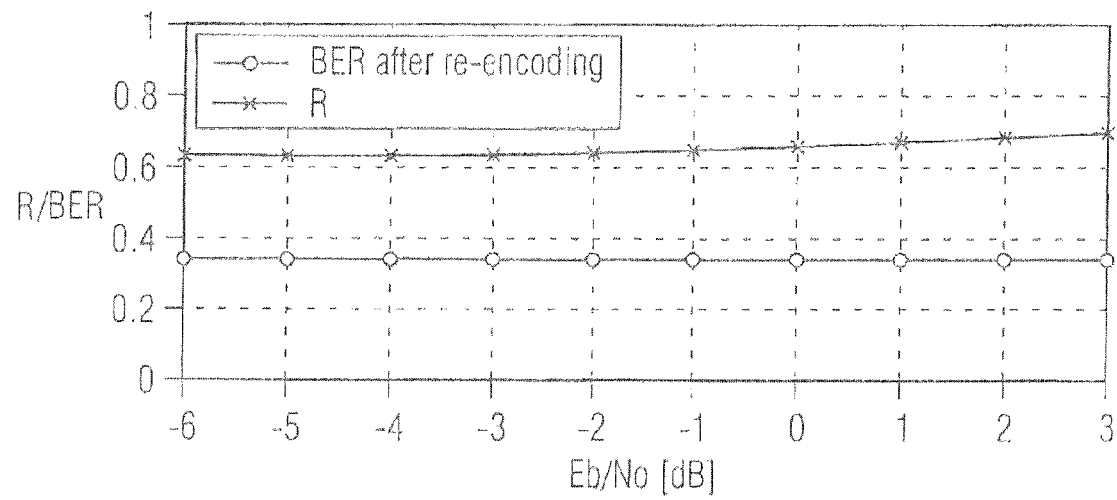
FIG. 5 is a graph illustrating an average bit error rate after re-encoding and an average control channel quality for a control channel which is not intended for a receiver.
Figure 6:
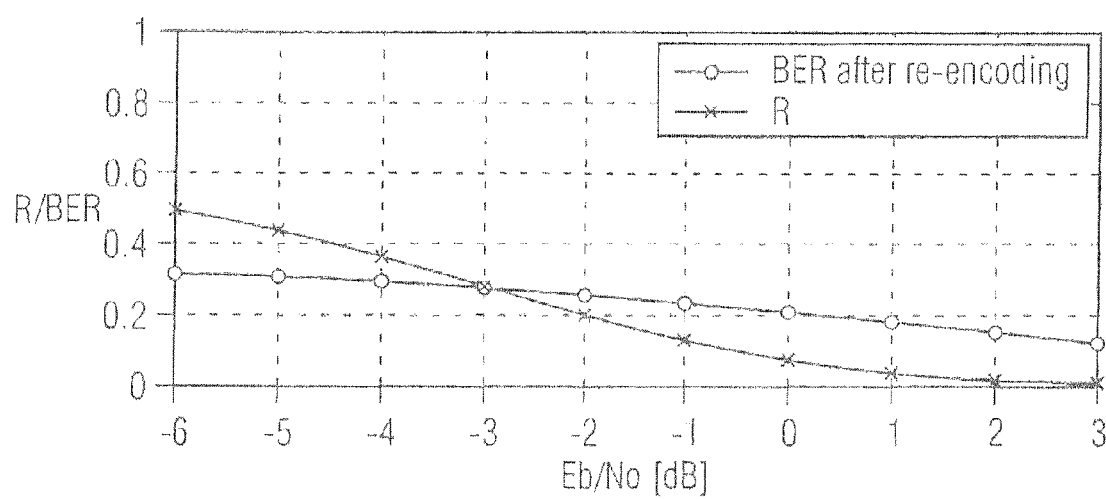
FIG. 6 is a graph illustrating an average bit error rate after re-encoding and an average control channel quality for a control channel which is intended for a receiver.

The second embodiment provides for a reliable and fast HS-SCCH detection without adding more complexity, i.e. hardware modules, to the receiver. The proposed HS-SCCH detection algorithm is based on the Viterbi decoders final state metrics which are exploited at the end of the Part 1 decoding. This approach provides for a finer tuning of the threshold and therefore for a better $P_{md}$ and $P_{fa}$ joint optimization compared to a conventional HS-SCCH detection and selection approach which is based on a BER (Bit Error Rate) channel quality estimation of HS-SCCHs. Such BER quality estimation involve re-encoding of the decoded data stream and comparing the re-encoded data with the received data prior to Viterbi decoding. If re-encoded data is substantially the same as the data before Viterbi decoding, the corresponding HS-SCCH is rated to have a high detection quality. Otherwise, the detection quality of the HS-SCCH is rated to be low and the data detection of the corresponding user data channel HS-PDSCH is inhibited. FIGS. 5 and 6 illustrate graphs which compare this conventional approach ("average BER after re-encoding") with the approach described herein ("average R"). Average BER after re-encoding and average R are plotted versus Eb/N0 (the energy per bit to noise power spectral density ratio) in units of dB. FIG. 5 shows the results when a HS-SCCHs not intended for a UE is detected and FIG. 6 shows the results when a HS-SCCH is detected which is intended for the UE. The conventional approach suffers from low sensitivity due to the limited number of bits available before channel decoding. In contrast thereto, using average R discrimination, a higher sensitivity and thus a considerably better $P_{md}$ and $P_{fa}$ joint optimization is possible.

It is to be noted that the detection of one or more control channels as described above is applicable to a wide range of receivers, including 3GPP-receivers, HSDPA-receivers, LTE-receivers (Long Term Evolution) etc. Further, the concepts described above by way of example in relation to downlink channels are also applicable to uplink control channels and user data channels, i.e. to a receiver located in a base station. For instance, HSUPA-receivers (High Speed Uplink Packet Access) may be implemented that way for enhanced detection of one or more uplink control channels transmitted by UEs.

Although the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A method for detection of a control channel in a receiver, comprising:
   receiving data transmitted via the control channel of the receiver;
   estimating a control channel receive quality based on a metric difference between a metric of a known final trellis state, which is defined by a predetermined tail bit sequence, and a minimum metric amongst metrics of trellis states, with the metrics being associated with the received control channel data; and
   deciding whether or not to detect the control channel based on the estimated control channel receive quality.

2. The method of claim 1, wherein the control channel receive quality comprises a ratio of the metric difference and another metric difference, the another metric difference being associated with the minimum metric and a maximum metric amongst the metrics of the trellis states.

3. The method of claim 2, wherein the control channel receive quality is related to the expression $R=(M_0-M_{min})/(M_{max}-M_{min})$, wherein $M_0$ is the metric of the known final trellis state, $M_{min}$ is the minimum metric amongst the metrics of the trellis states and $M_{max}$ is the maximum metric amongst the metrics of the trellis states.

4. The method of claim 1, wherein deciding whether or not to detect the control channel comprises:
   comparing the control channel receive quality with a threshold value; and
   deciding to detect the control channel if the control channel receive quality is higher than the threshold value.

5. The method of claim 4, further comprising:
   deciding to not detect the control channel if the control channel receive quality is below the threshold value.

6. The method of claim 1, wherein data transmitted via a plurality of control channels is received, further comprising:
   estimating the control channel receive qualities of the plurality of control channels;
   comparing the computed control channel receive qualities with each other to determine the control channel having the maximum control channel receive quality; and
   deciding whether or not to detect the control channel having the maximum control channel receive quality.

7. The method of claim 6, wherein the control channels of the plurality of control channels are high speed shared control channels of a wireless communications system.

8. A receive unit for detecting a control channel, comprising:
   a receiver configured to receive data transmitted via the control channel;
   a channel quality estimator configured to compute a control channel receive quality based on a metric difference between a metric of a known final trellis state, which is defined by a predetermined tail bit sequence, and a minimum metric amongst metrics of trellis states, wherein the metrics are associated with the received control channel data; and
   a deciding unit configured to decide whether or not to detect the control channel based on the estimated control channel receive quality.

9. The receive unit of claim 8, wherein the channel quality estimator is configured to compute the control channel receive quality as a ratio of the metric difference and another metric difference, wherein the another metric difference is associated with the minimum metric and a maximum metric among the metrics of the trellis states.

10. The receive unit of claim 9, wherein the channel quality estimator is configured to compute $R=(M_0-M_{min})/(M_{max}-M_{min})$, wherein R is related to the control channel receive quality, and wherein $M_0$ is the metric of the known final trellis state, $M_{min}$ is the minimum metric amongst the metrics of the trellis states, and $M_{max}$ is the maximum metric among the metrics of the trellis states.

11. The receive unit of claim 8, wherein the deciding unit comprises:
   a threshold comparator configured to compare the computed control channel receive quality with a threshold value,
   wherein the deciding unit is further configured to decide to detect the control channel if the control channel receive quality is higher than the threshold value.

12. The receive unit of claim 11, wherein the deciding unit is further configured to decide not to detect the control channel if the control channel receive quality is below the threshold value.

13. The receive unit of claim 8, wherein the receiver is configured to receive data transmitted via a plurality of control channels and the channel quality estimator is configured to compute control channel receive qualities of the plurality of control channels, further comprising:
   a quality comparator configured to compare the computed control channel receive qualities with each other to determine the control channel having the maximum control channel receive quality, and
   wherein the deciding unit is configured to decide whether or not to detect this control channel having the maximum control channel receive quality.

14. The receive unit of claim 8, wherein a first section of the channel quality estimator which is configured to compute the metric difference is implemented in hardware.

15. The receive unit of claim 8, wherein a second section of the channel quality estimator which is configured to compute the control channel receive quality based on the metric difference is implemented in software.

16. The receive unit of claim 8, wherein the deciding unit is implemented in software.

17. A method for selection of a control channel from a plurality of control channels in a receiver, comprising:
   receiving data transmitted via the plurality of control channels of the receiver;
   estimating a control channel receive quality based on a metric difference between a metric of a known final trellis state, which is defined by a predetermined tail bit sequence, and a minimum metric amongst metrics of trellis states for each of the plurality of control channels, wherein the metrics are associated with the received data of each respective control channel; and
   selecting one of the plurality of control channels based on an evaluation of the control channel receive qualities.

18. The method of claim 17, wherein the control channel receive quality comprises a ratio of the metric difference and another metric difference, the another metric difference being associated with the minimum metric and a maximum metric amongst the metrics of the trellis states.

19. The method of claim 18, wherein the control channel receive quality is related to the expression $R=(M_0-M_{min})/(M_{max}-M_{min})$, wherein $M_0$ is the metric of the known final trellis state, $M_{min}$ is the minimum metric amongst the metrics of the trellis states, and $M_{max}$ is the maximum metric amongst the metrics of the trellis states.

20. The method of claim 18, wherein selecting one of the plurality of control channels depends on an evaluation of the control channel receive qualities further comprises:
   comparing the computed control channel receive qualities with each other to determine the control channel having the maximum control channel receive quality; and
   selecting that control channel having the maximum control channel receive quality.

21. A receive unit for selecting a control channel from a plurality of control channels, comprising:
   a receiver configured to receive data transmitted via the plurality of control channels;
   a channel quality estimator configured to compute a control channel receive quality based on a metric difference between a metric of a known final trellis state, which is defined by a predetermined tail bit sequence, and a minimum metric amongst metrics of trellis states for each control channel, wherein the metrics are associated with the received data for each respective control channel; and
   a selector configured to select a control channel depending on an evaluation of the computed control channel receive qualities.

22. The receive unit of claim 21, wherein the channel quality estimator is configured to compute the control channel receive quality as a ratio of the metric difference and another metric difference, the another metric difference being associated with the minimum metric and a maximum metric amongst the metrics of the trellis states.

23. The receive unit of claim 22, wherein the channel quality estimator is configured to compute $R=(M_0-M_{min})/(M_{max}-M_{min})$ for each of the plurality of control channels, wherein R is related to the control channel receive quality, wherein $M_0$ is the metric of the known final trellis state, $M_{min}$ is the minimum metric amongst the metrics of the trellis states, and $M_{max}$ is the maximum metric amongst the metrics of the trellis states.

24. The receive unit of claim 22, wherein the selector comprises:
   a metrics comparator configured to compare the computed control channel receive qualities with each other to determine the control channel having the maximum control channel receive quality.

* * * * *